(12) United States Patent
O'Dell et al.

(10) Patent No.: US 8,933,182 B2
(45) Date of Patent: *Jan. 13, 2015

(54) POLYMER, ITS PREPARATION AND USES

(75) Inventors: Richard O'Dell, Taufkirchen (DE); Carl Towns, Cambridgeshire (GB); Mary McKiernan, Cottenham (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 167 days.

This patent is subject to a terminal disclaimer.

(21) Appl. No.: 13/189,465

(22) Filed: Jul. 22, 2011

(65) Prior Publication Data

US 2011/0279028 A1 Nov. 17, 2011

Related U.S. Application Data

(63) Continuation of application No. 10/475,027, filed as application No. PCT/GB02/01585 on Apr. 10, 2002, now Pat. No. 7,985,815.

(30) Foreign Application Priority Data

Apr. 11, 2001 (GB) .................................. 0109108.1

(51) Int. Cl.
*H01J 1/62* (2006.01)
*C08F 4/44* (2006.01)
(Continued)

(52) U.S. Cl.
CPC ............ *H01L 51/0043* (2013.01); *C08G 73/02* (2013.01); *C08G 73/026* (2013.01);
(Continued)

(58) Field of Classification Search
CPC ............ C09G 73/0644; H01L 51/0035; Y10S 428/917
See application file for complete search history.

(56) References Cited

U.S. PATENT DOCUMENTS

| 4,539,507 A | 9/1985 | VanSlyke et al. ............. 313/504 |
| 5,281,489 A * | 1/1994 | Mori et al. .................... 428/690 |

(Continued)

FOREIGN PATENT DOCUMENTS

| DE | 196 28 719 A1 | 1/1998 |
| EP | 129 036 A2 | 12/1984 |

(Continued)

OTHER PUBLICATIONS

Borovik et al., "Convenient Synthesis of 2-Phenyl-4,6-bis(aminophenyl)-S-triazines", Sibirskii Khimicheskii Zhurnal 4 (Journal), 1991.

(Continued)

*Primary Examiner* — Jennifer Chriss
*Assistant Examiner* — Camie Thompson
(74) *Attorney, Agent, or Firm* — Marshall, Gerstein & Borun LLP

(57) ABSTRACT

A polymer comprising a first repeat unit comprising $Ar^hX_2$ wherein $Ar^hX_2$ comprises a substituted or unsubstituted heteroaryl group and each X is the same or different and independently comprises a substituted or unsubstituted aryl or heteroaryl group and a second repeat unit that is adjacent to the first repeat unit wherein each X that is part of a main body of the polymer backbone is directly conjugated to the second repeat unit.

9 Claims, 1 Drawing Sheet

(51) Int. Cl.
*H01L 51/00* (2006.01)
*C08G 73/02* (2006.01)
*C08G 73/06* (2006.01)
*C09K 11/06* (2006.01)
*H01L 51/50* (2006.01)

(52) U.S. Cl.
CPC ............ *C08G73/0644* (2013.01); *C09K 11/06* (2013.01); *H01L 51/0035* (2013.01); *C09K 2211/1408* (2013.01); *C09K 2211/1416* (2013.01); *C09K 2211/1425* (2013.01); *C09K 2211/1433* (2013.01); *C09K 2211/1466* (2013.01); *H01L 51/0039* (2013.01); *H01L 51/0059* (2013.01); *H01L 51/50* (2013.01); *Y10S 428/917* (2013.01)
USPC ................ 526/125.6; 526/131; 528/4; 528/8; 528/332; 428/690; 428/917; 313/504; 313/506; 313/509; 257/40

(56) References Cited

U.S. PATENT DOCUMENTS

| | | | |
|---|---|---|---|
| 5,777,070 | A | 7/1998 | Inbasekaran et al. .......... 528/394 |
| 6,255,483 | B1 | 7/2001 | Fletcher et al. ............... 544/216 |
| 6,352,791 | B1 | 3/2002 | Fink et al. ..................... 428/690 |
| 6,512,082 | B2* | 1/2003 | Towns et al. .................. 528/394 |
| 6,730,417 | B2 | 5/2004 | Hu et al. ....................... 428/428 |
| 6,821,643 | B1* | 11/2004 | Hu et al. ....................... 428/690 |
| 6,861,502 | B1* | 3/2005 | Towns et al. .................. 528/422 |
| 7,348,428 | B2 | 3/2008 | O'Dell et al. ................. 544/209 |
| 7,985,815 | B2* | 7/2011 | O'Dell et al. ............... 526/125.3 |
| 2003/0170490 | A1 | 9/2003 | Hu et al. ....................... 428/690 |

FOREIGN PATENT DOCUMENTS

| | | | |
|---|---|---|---|
| EP | 668 529 | A2 | 8/1995 |
| EP | WO 98/11150 | * | 3/1998 |
| JP | 1992-354736 | | 12/1992 |
| JP | 1993-229685 | | 8/1993 |
| JP | 2005-268022 | A | 9/2005 |
| WO | WO 90/13148 | | 11/1990 |
| WO | WO 92/03490 | | 3/1992 |
| WO | WO 98/11150 | | 3/1998 |
| WO | WO 99/32537 | | 7/1999 |
| WO | WO 99/48160 | | 9/1999 |
| WO | WO 99/54385 | | 10/1999 |
| WO | WO 00/46321 | | 8/2000 |
| WO | WO 00/53656 | | 9/2000 |
| WO | WO 00/55927 | | 9/2000 |

OTHER PUBLICATIONS

Fink et al., "Aromatic Polyethers With 1,3,5-triazine Units as Hole Blocking/Electron Transport Materials in LEDs", Polymer Preprints, American Chemical Society, Division of Polymer Chemistry 38(1), 1997.

Friend et al., "Electroluminescence in Conjugated Polymers", Nature, vol. 397, Jan. 14, 1999, pp. 121-128.

Kreyenschmidt et al., "Thermally Stable Blue-Light-Emitting Copolymers of Poly(Alkylfluorene)", Macromolecules 31, 1998, pp. 1099-1103.

Matsuo, "Synthesis and Properties of Poly(Arylene Ether Phenyl-s-Triazine)s", Journal of Polymer Science, Part A: Polymer Chemistry, vol. 32, 1994, pp. 2093-2098.

Thelakkat et al., "Low Molecular Weight and Polymeric Heterocyclics as Electron Transport/Hole-Blocking Materials in Organic Light-Emitting Diodes", Polymers for Advanced Technologies, Polym. Adv. Technol. 9, 1998, pp. 429-442.

International Search Report in PCT/GB02/01585 dated Oct. 22, 2002.

International Preliminary Examination Report in PCT/GB02/01585 dated May 15, 2003.

Search Report in GB 0109108.1 dated Oct. 23, 2001.

Miyaura et al., "The Palladium-Catalyzed Cross-Coupling Reaction of Phenylboronic Acid With Haloarenes in the Presence of Bases," *Synthetic Communications*, 11(7):513-519 (1981).

* cited by examiner

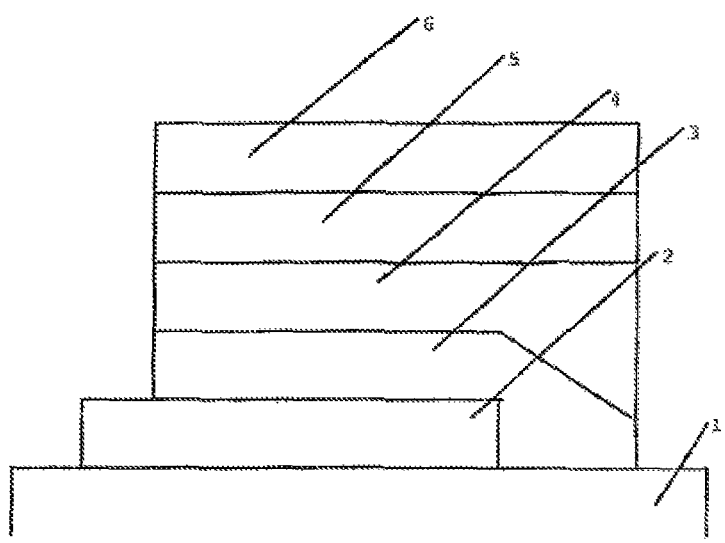

POLYMER, ITS PREPARATION AND USES

CROSS-REFERENCE TO RELATED APPLICATION

This is a continuation of U.S. patent application Ser. No. 10/475,027 filed Mar. 12, 2004 (now U.S. Pat. No. 7,985, 815), which is the national phase of International Application No. PCT/GB02/01585 filed Apr. 10, 2002, the entire respective disclosures of which are incorporated by reference in their entirety.

The present invention relates to a polymer and uses thereof such as in an optical device, and to a process for preparing such a polymer.

Organic electroluminescent devices which use an organic material as the light-emissive material are known in this art. Among organic materials, simple aromatic molecules such as anthracene are known to show electroluminescence. U.S. Pat. No. 4,539,507 discloses the use of small molecule organic materials as the light-emissive material, for example 8-hydroxyquinoline (aluminium). PCT/WO90/13148 discloses an electroluminescent device comprising a semiconductor layer comprising a polymer film as the light-emissive layer which comprises at least one conjugated polymer. In this case, the polymer film comprises a poly(para-phenylene vinylene) (PPV) film.

It is known to use a semiconductive conjugated co-polymer as the light-emissive layer in an electroluminescent device. The semiconductive conjugated copolymer comprises at least two chemically different monomers which, when existing in their individual homopolymer forms, typically have different semiconductor bandgaps. The proportion of the chemically different monomer units in the copolymer can be selected to control the semiconductor bandgap of the copolymer so as to control the optical properties of the copolymer as disclosed in PCT/GB91/01420. The extent of conjugation of the copolymer affects the $\pi$-$\pi$* bandgap of the copolymer (i.e. the difference in energy between the HOMO and LUMO levels of the copolymer). This property may be exploited so that the semiconductor bandgap is modulated to control the wavelength of radiation emitted during luminescence. In addition, by modulating the semiconductor bandgap of the copolymer it is possible to increase the quantum efficiency of the copolymer when exited to luminesce. Furthermore, the semiconductor bandgap is a factor affecting the refractive index of the copolymer.

For organic semiconductors important characteristics are the binding energies, measured with respect to the vacuum level of the electronic energy levels, particularly "the highest occupied molecular orbital" (HOMO) and "lowest unoccupied molecular orbital" (LUMO) levels. The oxidation potential and reduction potential of different polymers is governed by the relative HOMO and LUMO energy levels of the polymer. Thus, the HOMO and LUMO levels can be estimated from measurement of photoemission and particularly measurements of the electrochemical potentials for oxidation and reduction. It is well understood in the field that such energies are affected by a number of factors, such as the local environment near an interface, and the point on the curve (peak) from which the value is determined. Accordingly, the use of such values is indicative rather than quantitative.

A typical device for emitting light may have an anode layer of transparent indium-tin oxide (ITO) and a cathode layer of LiAl. Between the electrodes is a light-emissive layer of, for example, PPV. In use, holes and electrons that are injected into the device recombine radiatively in the PPV layer. Holes are injected from the ITO anode to the HOMO level of the PPV. Electrons are injected from the LiAl cathode to the LUMO level of the PPV. An important feature of such a device may be the inclusion of a hole transport layer between the anode and the PPV layer of, for example, polyethylene dioxythiophene (PEDOT). This polymer is disclosed in EP 0686662. This provides an energy level intermediate the work function of the ITO anode and the HOMO level in the PPV which helps the holes injected from the ITO to reach the HOMO level in the PPV.

In Nature, 397, 121-128 (1999), a molecular material is used as a hole transport layer. A molecular material has the disadvantages associated with using small molecule layers in a device. A further molecular material is disclosed in this document as an electron transport layer. In this regard, known device structures also may have an electron transport layer situated between a cathode and the light-emissive layer. This provides an energy level which helps the electrons injected from the cathode to reach the LUMO level of the material constituting the light-emissive layer. Suitably, the electron transporting layer has a LUMO energy level between the work function of the cathode and the LUMO energy level of the light-emissive material.

Hole transport materials and electron transport materials generally may be referred to as charge transport materials.

WO 99/32537 is concerned with a charge transport material comprising a polymer, particularly for use in electro reprographic devices and electroluminescent devices. The polymer comprises at least one repeat unit consisting substantially of a moiety having formula:

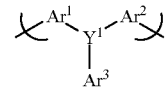

in which $Y^1$ represents N, P, S, As and/or Se; $Ar^1$ and $Ar^2$ which may be the same or different represent a multivalent aromatic group and $Ar^3$ represents a mono or multivalent aromatic group where at least one terminal group is attached in the polymer to the $Ar^1$, $Ar^2$ and optionally $Ar^3$ groups located at the end of the polymer chains so as to cap the polymer chains to prevent further polymer growth.

WO 99/54385 discloses fluorene-containing polymers which can be used as a light-emitting and/or hole-transport layer in an electroluminescent device. Generally, this document is concerned with polymers such as:

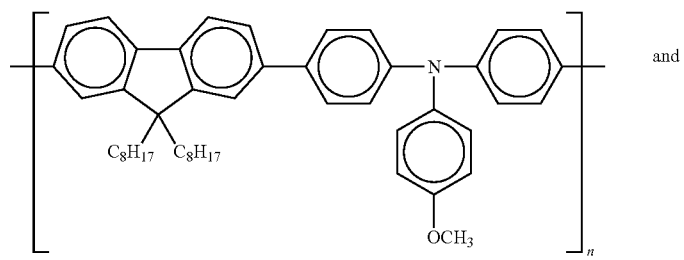

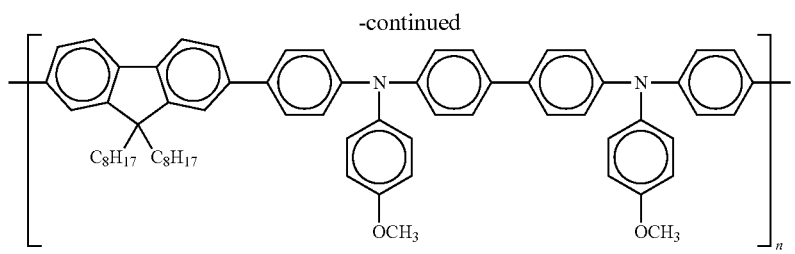

where n is a number >3.

WO 00/46321 also is concerned with fluorene copolymers and electronic devices (such as polymer light-emitting diodes) containing one or more films derived from these copolymers. The copolymers are suggested to be light-emitting copolymers.

It may be noted that a polymer having a HOMO or LUMO level such that the polymer is rendered useful as a charge transport material, as described above, also may have a semiconductor bandgap rendering it useful as a light-emissive material.

Macromolecules 1998, 31, 1099-1103 is concerned with thermally stable blue-light emitting copolymers of poly(alkylfluorene).

WO 98/11150 discloses electroluminescent copolymers comprising 1,3,5-triphenyltriazine repeat units with phenol and imide repeat units. These repeat units are not conjugated to one another.

In view of the prior art, there still remains a need to provide new charge transport polymers suitable for use in optical devices, particularly electroluminescent devices. Preferably, the new polymers would have improved properties such as increased efficiency, improved lifetime and perhaps increased brightness when used in a device.

The present invention aims to at least partially meet this need and to provide such a polymer.

Accordingly, in a first aspect, the present invention provides a polymer comprising a first repeat unit comprising $Ar^hX_2$ wherein $Ar^h$ comprises a substituted or unsubstituted heteroaryl group and each X is the same or different and independently comprises a substituted or unsubstituted aryl or heteroaryl group and a second repeat unit that is adjacent to the first repeat unit wherein each X that is part of a main body of the polymer backbone is directly conjugated to the second repeat unit.

By "each X that is part of a main body of the polymer backbone" is meant each X in the polymer backbone not being the last aryl moiety at the end of a polymer backbone or not being directly linked to a polymer end-capping group.

Each first repeat unit is directly conjugated with the second repeat unit through each X. The second repeat unit may be the same as or different from the first repeat unit. Where the first and second repeat units are the same, two X groups belonging to different $Ar^hX_2$ groups are conjugated together. Where the first and second repeat units are different, X is conjugated with an aryl group of the second repeat unit. Preferred second repeat units are optionally substituted phenylenes, fluorenes, heteroaryls and triarylamines.

Particularly preferred fluorene repeat units include 2,7-linked 9,9 dialkyl fluorene, 2,7-linked 9,9 diaryl fluorene, 2,7-linked 9,9-spirofluorene and 2,7-linked indenofluorene.

Particularly preferred triarylamine repeat units include those having formulae a-f:

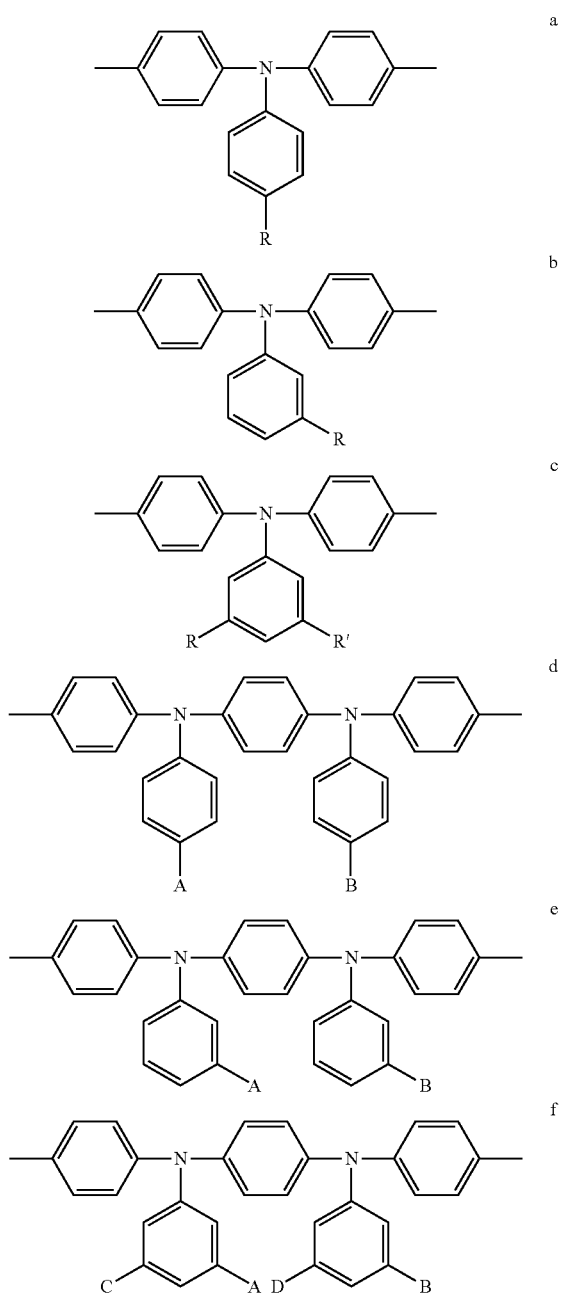

R and R' may be the same or different and are substituent groups. A, B, C and D may be the same or different and are substituent groups. It is preferred that one or more of R, R', A, B, C and D is independently selected from the group consisting of alkyl, aryl, perfluoroalkyl, thioalkyl, cyano, alkoxy, heteroaryl, alkylaryl and arylalkyl groups. One or more of R, R', A, B, C and D also may be hydrogen. It is preferred that one or more of R, R', A, B, C and D is independently an unsubstituted, isobutyl group, an n-alkyl, an n-alkoxy or a trifluoromethyl group because they are suitable for helping to select the HOMO level and/or for improving solubility of the polymer.

Particularly preferred heteroaryl repeat units are disclosed in WO 00/55927 and WO 00/46321.

It has been found that the incorporation of a repeat unit as defined above into a polymer according to the present invention provides materials with the attractive physical and processing properties of polymers and the ability in their synthesis to select the aryl or heteroaryl groups and their substituents so as to modulate the bandgap of the polymer. This is an important feature, particularly in the design of optical devices. Firstly, the bandgap of the polymer will control the wavelength of light emitted from such a device. Furthermore, where the polymers are used as charge transport materials, the quantum efficiency of the device will depend upon the matching of the HOMO and/or LUMO levels of the polymer with the cathode and anode and device light-emitting materials.

For photoluminescence, quantum efficiency is defined as photons out per photon absorbed. For electroluminescence quantum efficiency is defined as photons out per electron injected into the structure.

Efficiency of a device containing a polymer according to the present invention may be measured as lumens per watt [Lm/W]. A device containing a polymer according to the present invention may have equal or superior efficiency, brightness and lifetime in an optical device at a low drive voltage as compared with devices containing polymers known in the art.

For the purposes of the present invention, the term "polymer" should be interpreted as including linear and branched polymers; homopolymers; copolymers; terpolymers and higher order polymers. In this regard, a homopolymer (i.e. prepared by polymerisation of a single type of monomer or from different monomers that lead to the same monomeric residue in the resulting polymer) may be defined to have more than one different repeat unit.

Where the polymer is made from more than one different monomer, the resultant polymer may be a regular alternating, block or random polymer.

It has been found that including a repeat unit as defined above into a polymer according to the present invention is desirable as a charge, particularly electron, transport repeat unit in a polymer for use in an electroluminescent device. The greater degree of conjugation in the polymers by comparison with those disclosed in WO 98/11150, in particular conjugation between adjacent repeat units, leads to improved charge transport along the polymer backbone.

It may be noted that Sib. Khim. Zh. (1991), 4, pages 96 to 98 is concerned with the cyclocondensation of PhCH:NPh with ArC(:NH)NH$_2$ (Ar=m-, p-O$_2$NC$_6$H$_4$, p-BrC$_6$H$_4$, p-ClC$_6$H$_4$) followed by amination. The compound 2,4-bis(p-bromophenyl)-6-phenyltriazine would be an intermediate to this reaction. However, this compound is not incorporated into a polymer but is aminated to produce the desired end product.

The present polymer is at least partially conjugated along the polymer backbone, in particular at least conjugated between adjacent repeat units. Preferably, it is substantially or even fully conjugated. Selection of the extent of conjugation along the polymer backbone is thought to be one way of controlling the HOMO and LUMO levels of the polymers and thus its charge transport properties.

Typically, the present polymer will be soluble in non-polar solvents. Typical solvents include common organic solvents, toluene, xylene, THF and organic inkjet ink formulations.

Although other heteroaryl groups also may be preferred, the present inventors have found that particularly advantageous polymers according to the present invention can be prepared where $Ar^h$ comprises a substituted or unsubstituted heteroaryl group that comprises at least one Group V atom, preferably a nitrogen atom. This is preferred because the presence of a nitrogen atom in the ring of the heteroaryl group renders the ring highly electron deficient and so amenable to electron injection.

This effect can be increased by including further nitrogen atoms in the ring of the heteroaryl group. Accordingly, in order to provide greater potential for controlling the HOMO and LUMO levels of the polymer, it is preferred that $Ar^h$ comprises greater than 1 nitrogen atom and preferably a triazine group.

It is preferred that $Ar^h$ comprises at least one further substituent, in addition to the two X groups. In this regard, particularly where $Ar^h$ comprises a six membered ring, it is preferred that $Ar^h$ comprises a 2,4,6 trisubstituted heteroaryl groups.

Where $Ar^h$ comprises at least one further substituent, it is preferred that the first repeat unit comprises $Ar^hX_3$ where each X is as defined above. Where $Ar^h$ is part of the polymer backbone, $Ar^hX_3$ is preferably incorporated into the polymer backbone as shown in formula (1) below:

(1)

This structure with an X group on either side of the $Ar^h$ group in the polymer backbone is preferred because it results in a desirable extent of conjugation along the polymer backbone. As mentioned above, the extent of conjugation can be used to select the HOMO and LUMO levels and the bandgap and the quantum efficiency of the polymer. Typically, an increase in conjugation will result in a decrease in the bandgap.

The nature of the X groups also can be used to some extent to select the properties of the polymer. In particular, they may be used to affect the HOMO and LUMO levels of the polymer and, thus, the bandgap and the quantum efficiency of the polymer.

As mentioned above, X and $X^1$ may be the same or different. However, for ease of manufacture and synthesis of the polymer, it is envisaged that typically X and $X^1$ will be the same.

In order to optimise the potential for modifying the HOMO and LUMO levels of the polymer, where the first repeat unit comprises $Ar^hXX^1X^2$, $X^2$ may be different from X and $X^1$. However, this is not essential. In fact, it is envisaged that it may be desirable for $X^2$ to be the same as X and $X^1$ if a polymer having a desirable HOMO and LUMO level and, thus, a desirable bandgap and quantum efficiency is obtained. $X^2$ also may be used to increase the solubility of the polymer. In this regard, the $X^2$ group may be a solubilising group.

X, $X^1$ and $X^2$ may be substituted or unsubstituted. Usefully, substituents may be used to improve the solubility of the polymer. In this regard a substituent may be a solubilising group. In addition, substituents may be used to further control the HOMO and LUMO levels of the polymer and, thus, the bandgap of the polymer. For these purposes, electron withdrawing or electron donating substituents are suitable. Particularly preferred substituents are halide, cyano, alkyl, alkoxy, and substituted or unsubstituted aryl and heteroaryl groups. Particularly preferred substituents include perfluoroalkyl (preferably $CF_3$) and perfluoroalkoxy.

Referring again to X and $X^1$ it is preferred that, each independently comprises a substituted or unsubstituted phenyl group.

In this regard, a particularly preferred first repeat unit in a polymer according to the present invention is as shown in formula (2):

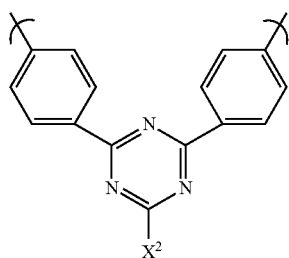

(2)

where $X^2$ is as defined above.

Preferably, $X^2$ also comprises a substituted or unsubstituted phenyl group. Accordingly, a particularly preferred first repeat unit having a formula as shown in formula (2) is as shown in formula (3):

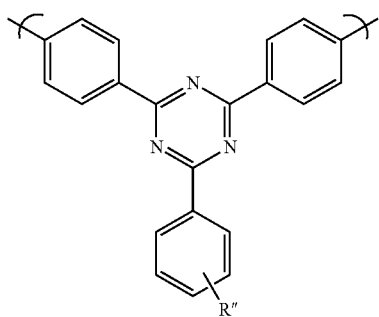

(3)

Repeat units (2) and (3) shown above may be substituted or unsubstituted. In particular, R" is selected from hydrogen, or optionally substituted branched or linear C1-20 alkyl or alkoxy.

As mentioned above, it is envisaged that the present polymer will be useful for hole transport, electron transport and/or emitting light in an optical device. In this regard, it is envisaged that a homopolymer according to the present invention will particularly be useful as an electron transport polymer or a light-emissive polymer. Furthermore, it is envisaged that a copolymer or higher order polymer according to the present invention including an aryl, particularly a fluorene repeat unit for example will be useful particularly as an electron transport polymer or a light-emissive polymer. Such a copolymer or higher order polymer may be expected to have a LUMO energy level in the range of common cathode materials such as Ca at about 2.9 eV.

Due to the nature of the first repeat unit defined above, it is envisaged that when the present polymers are used as light-emissive polymers in an optical device, although not so limited, they predominantly will be useful as sources of "blue" light.

For the purposes of the present invention, "blue" light may be defined as light having a wavelength 360 nm to 490 nm.

Preferably, polymers according to the present invention have a degree of polymerisation of at least 3.

Preferably, polymers according to the present invention have an average molecular weight of at least mn=10,000.

The present invention also provides a composition comprising a mixture or blend comprising one or more polymers according to the first aspect of this invention.

A film or coating comprising a polymer according to the present invention also is provided.

According to a second aspect of the present invention, there is provided the use of the present polymer as a component of an optical device. Specifically, the optical device may comprise an electroluminescent device.

Other uses for the present polymer may include the use as a component in a photovoltaic or photoluminescent device, wave guide, fluorescent dye composition, fibre sensor or detector.

As mentioned above, it is preferred that the present polymer is soluble. This confers the advantage of allowing the polymer to be processed in solution.

In a third aspect of the present invention, there is provided an optical device comprising a substrate and a composition supported by the substrate, which composition comprises a polymer according to the present invention.

Preferably, the optical device comprises an electroluminescent device.

A preferred electroluminescent device according to the present invention comprises a first charge injecting layer for injecting positive charge carriers, a second charge injecting layer for injecting negative charge carriers, a light-emissive layer for accepting and combining positive and negative charge carriers from the first and second charge injecting layers to generate light and optionally, one or more charge transport layers located either between the first charge injecting layer and the light-emissive layer or between the second charge injecting layer and the light-emissive layer. The light-emissive layer and/or one or more of the one or more charge transport layers comprises a polymer as defined in the first aspect according to the present invention.

It will be appreciated that the light-emissive layer may be formed from a blend of materials including one or more polymers according to the present invention, and optionally further different polymers as disclosed in, for example, WO 99/48160.

As mentioned above, the one or more polymers according to the present invention may be included in order to improve the efficiency of hole and/or electron transport from the electrodes to the light-emissive material. Alternatively, a polymer according to the present invention may be included as the light-emissive material itself. In this case, the blend would comprise greater than 0.1% by weight of a polymer according to the present invention, preferably from 0.5 to 50% by weight, with the remainder of the blend comprising hole and/or electron transport polymers.

Alternatively, as indicated above, a polymer according to the present invention may be provided in an electroluminescent device as a discrete layer situated between either the first or second charge injecting layer and a discrete layer comprising the light-emissive material. Also, it may be provided as a discrete layer which is the light-emissive material. These discrete layers optionally may be in contact with one or more (additional) hole and/or electron transporting layers.

In a fourth aspect of the present invention, there is provided a method for preparing a polymer as defined in the first aspect of the present invention comprising a step of reacting a first monomer with a second monomer that may the same or different from the first monomer under conditions so as to polymerise the monomers to form a polymer.

Several different polymerisation methods are known which may be used to manufacture polymers in accordance with the present invention including Suzuki polymerisation as disclosed in, for example, Suzuki et al, Synth. Comm. 1981, 11, 513. This entails the coupling together of aryl moieties of monomers by means of a palladium catalyst.

One particularly suitable Suzuki polymerisation process is disclosed in International patent publication No. WO 00/53656, the contents of which are incorporated herein by reference. This describes a process for preparing a polymer comprising polymerising in a reaction mixture (a) a first aromatic monomer having at least two reactive boron derivative groups selected from a boronic acid group, a boronic ester group and a borane group, and a second aromatic monomer having at least two reactive halide functional groups; or (b) a first aromatic monomer having one reactive halide functional group and one reactive boron derivative group selected from a boronic acid group, a boronic ester group and a borane group and a second aromatic monomer having one reactive halide functional group and one reactive boron derivative group selected from a boronic acid group, a boronic ester group and a borane group, wherein the reaction mixture comprises a catalytic amount of a palladium catalyst suitable for catalysing the polymerisation of the aromatic monomers, and a base in an amount sufficient to convert the reactive boron derivative functional groups into —BX'3-anionic groups, wherein X' is independently selected from the group consisting of F and OH.

The first and second monomers according to part (b) of the above process may be the same or different.

Polymers according to the present invention which have been produced by this process are particularly advantageous. This is because reaction times are short and residual catalyst (e.g. palladium) levels are low.

Another polymerisation method is disclosed in U.S. Pat. No. 5,777,070. The process involves contacting monomers having two reactive groups selected from boronic acid, C1-C6 boronic acid ester, C1-C6 borane and combinations thereof with aromatic dihalide functional monomers or monomers having one reactive boronic acid, boronic acid ester or borane group and one reactive halide functional group with each other in the presence of an inorganic base and a phase transfer catalyst.

A further polymerisation method is known from "Macromolecules", 31, 1099-1103 (1998). The polymerisation reaction involves nickel-mediated coupling of dibromide monomers. This method commonly is known as "Yamamoto Polymerisation". Both Yamamoto and Suzuki polymerisations are suited to preparation of polymers in accordance with the invention as they both produce polymers by coupling together the aryl moieties of monomers.

In a fifth aspect, the invention provides a monomer for the preparation of a polymer comprising a unit having a formula as shown in formula (4):

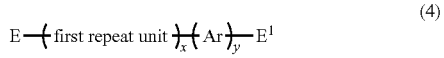

(4)

where x≥1, y≥0, the first repeat unit is as defined above, Ar is a substituted or unsubstituted aryl or heteroaryl group and E and E1 are the same or different and are reactive groups capable of undergoing chain extension.

Preferably, E and E1 are the same or different and are selected from the group consisting of a reactive halide functional group and a reactive boron derivative group. Preferably, x=1 and y=0. Preferably, the first repeat unit comprises solubilising groups. Particularly preferred solubilising groups are optionally substituted linear or branched C1-20 alkyl or alkoxy groups.

The present invention now will be described in further detail with reference to the accompanying drawings in which:

FIG. 1 is a schematic diagram of an optical device.

EXAMPLE 1

Preparation of a Monomer Suitable for the Preparation of a Polymer According to the Present Invention A monomer according to the invention was prepared as outlined in the scheme below in accordance with the method disclosed in V P Borovik & V P Mamaev, "Convenient synthesis of 2-phenyl-4,6-bis(aminophenyl)-S-triazines", Sib. Khim. Zh. (1991), (4), 96-8.

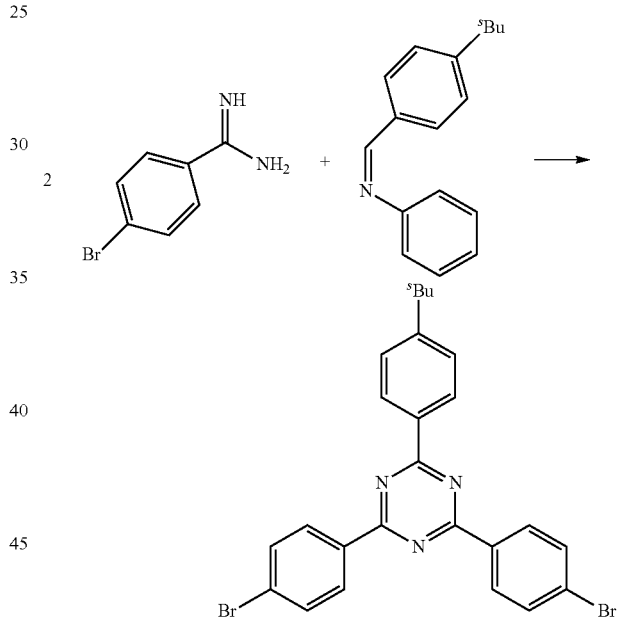

Preparation of a Polymer According to the Present Invention

The monomer prepared above is polymerised with 9,9-dioctylfluorene diester in accordance with the method disclosed in International patent publication No. WO 00/53656 to produce a polymer according to the present invention.

EXAMPLE 2

Optical Device

A suitable device structure is shown in FIG. 1. The anode 2 has a layer of transparent indium-tin oxide supported on a glass or plastic substrate 1. The anode 2 layer has a thickness between 1000 to 2000 Å, usually about 1500 Å. The cathode 5 is a Ca layer having an approximate thickness of 1500 Å. Between the electrodes is a light-emissive layer 4 having a thickness up to about 1000 Å. The light-emissive layer 4 comprises between 0.5 to 30% by weight of a polymer according to the present invention as a light-emissive material with the remainder of the light-emissive layer consisting of hole and/or electron transport material. Advantageously, the device includes a hole transport material layer 3 of PEDOT having a thickness of about 1000 Å. Layer 6 is an encapsulant layer of suitable thickness.

What is claimed:

1. A conjugated co-polymer comprising:
a first repeat unit having a formula as shown in formula (3):

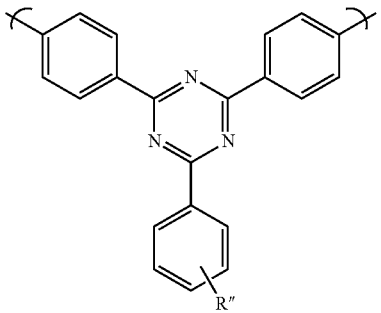

(3)

wherein R" is selected from the group consisting of hydrogen, branched C1-20 alkyl, linear C1-20 alkyl, and alkoxy; and
  a second repeat unit that is adjacent to the first repeat unit such that the polymer has a conjugated backbone, wherein the second repeat unit is an optionally substituted triarylamine.

2. A conjugated co-polymer according to claim 1, wherein the copolymer is a regular, alternating copolymer.

3. An optical device comprising a conjugated co-polymer according to claim 1.

4. An optical device according to claim 3, wherein the conjugated co-polymer is capable of emitting light having a wavelength between 360 nm and 490 nm.

5. An optical device according to claim 3, comprising a substrate and a composition supported by the substrate, the composition comprising the conjugated co-polymer.

6. An optical device according to claim 5, which comprises an electroluminescent device.

7. An optical device comprising:
   (a) a first charge injecting layer for injecting positive charge carriers;
   (b) a second charge injecting layer for injecting negative charge carriers;
   (c) a light-emissive layer for accepting and combining positive and negative charge carriers from the first and second charge injecting layers to generate light; and
   (d) optionally, one or more charge transport layers located either between the first charge injecting layer and the light-emissive layer or between the second charge injecting layer and the light-emissive layer;
   wherein the light-emissive layer and/or at least one charge transport layer comprises a conjugated co-polymer as defined in claim 1.

8. An optical device according to claim 7, wherein the light-emissive layer comprises a blend comprising said conjugated co-polymer.

9. An optical device according to claim 7, which comprises an electroluminescent device.

* * * * *